United States Patent [19]

Sakaguchi et al.

[11] Patent Number: 5,048,408
[45] Date of Patent: Sep. 17, 1991

[54] BUNDLING DEVICE

[75] Inventors: Satoru Sakaguchi; Kohei Tujino, both of Kobe, Japan

[73] Assignee: Bando Chemical Industries, Ltd., Kobe, Japan

[21] Appl. No.: 506,843

[22] Filed: Apr. 10, 1990

[30] Foreign Application Priority Data

Apr. 11, 1989 [JP] Japan .................. 1-42319

[51] Int. Cl.⁵ .................. B65B 27/06; B65B 13/18
[52] U.S. Cl. .................. 100/12; 100/8; 100/17; 100/33 R
[58] Field of Search .................. 100/8, 12, 17, 33 R, 100/33 PB

[56] References Cited

U.S. PATENT DOCUMENTS

| | | | |
|---|---|---|---|
| 2,052,627 | 9/1936 | Hermann | 100/33 R X |
| 2,259,707 | 10/1941 | Saxton | 100/17 |
| 2,274,526 | 2/1942 | Bunn | 100/17 X |
| 2,346,786 | 4/1944 | Radeck | 100/17 X |
| 3,068,780 | 12/1962 | Gates et al. | 100/17 X |
| 3,104,606 | 9/1963 | Kerrigan | 100/17 X |
| 4,316,760 | 2/1982 | Satomi | 100/8 X |

FOREIGN PATENT DOCUMENTS

| | | | |
|---|---|---|---|
| 0083159 | 7/1983 | European Pat. Off. | 100/8 |
| 1378851 | 10/1964 | France | 100/17 |
| 2470057 | 6/1981 | France | 100/8 |
| 2537944 | 6/1984 | France | 100/8 |
| 51-88397 | 8/1976 | Japan | 100/12 |

Primary Examiner—Harvey C. Hornsby
Assistant Examiner—Stephen F. Gerrity
Attorney, Agent, or Firm—Wenderoth, Lind & Ponack

[57] ABSTRACT

The present invention is embodied as a device for bundling annular articles. This device utilizes a tape bundling machine which bundles articles with an adhesive bundling tape. A pressing table which pinches a top end of the tape is made detachable from a receiprocable slide shaft. Upon retraction of the slide shaft, the pressing table is detached from the slide shaft and is transferred to a side of a base stand. A bundle of articles is discharged through a gap formed between the slide shaft and the pressing table.

9 Claims, 4 Drawing Sheets

BUNDLING DEVICE

FIELD OF THE INVENTION

This invention relates to a bundling device for bundling annular articles, such as transmission belts, O-rings, electric wire coils, etc.

DESCRIPTION OF THE PRIOR ART

An example of a device for bundling annular articles is disclosed in Japanese Patent Application Laying Open Gazette No. 51-88397. According to this device, an arch-shaped bundling tape feeding and guiding member which stands upright on a table is made openable in two divisions or is made separable in relation to the surface of the table so that it is separated from the surface of the table. Accordingly, supply and discharge of annular articles (articles to be bundled) can be effected from any direction of the table. Thus, this device aims to improve the efficiency of a bundling operation. This device, however, is of a large scale and is unfit for mass production if it is to be used for bundling annular articles of various kinds and shapes. Therefore, it must be used in conjunction with a special ordering system for manufacturing and is expensive.

An object of the present invention is to provide an improved tape bundling device for bundling articles with an adhesive tape, which is simplified in construction and is inexpensive to manufacture.

SUMMARY OF THE INVENTION

In order to attain the above object, the bundling device of the present invention comprises a bundling arm which is supported swingably by a base stand for movement between a standby position and a bundling position, an arm driving means which swings said bundling arm, a tape feed means which is arranged on the base stand and which can feed out an adhesive bundling tape in sequence from a free end of the bundling arm, a slide shaft reciprocably supported on the base stand, a shaft driving means for moving said slide shaft, a pressing table which holds a forward end portion of a bundling tape extending from a free end of the bundling arm, and is positioned at a forward end of the device such that it is supported by the slide shaft when the slide shaft is in an extended position and a holding means which is fixed to the base stand and separates the pressing table from the slide shaft while the slide shaft is retreating. The pressing table works in concert with a free end of the bundling arm to bundle articles with the adhesive bundling tape.

As a preferable composition, the above arm driving means comprises a column standing on a base stand, an axis of rotation supported rotatably at an upper end of said column, a crank arm fixed to and rotatable with said axis of rotation, a link which connects the other end of said crank shaft to a top end of the bundling arm and a driving system which rotates said axis of rotation. The above shaft driving means comprises an engaging groove provided at a rear end of the slide shaft and extending in the direction at a right angle to the moving direction of the slide shaft, a roller which engages rollingly with said engaging groove, a crank arm which rotatably supports the roller at a top end thereof, with its base end fitted rotatably to the axis of rotation and a driving system for rotating said axis of rotation. A magnet is used for separably supporting the pressing table at a forward end of the slide shaft. A pressing member is provided and allows articles held by the shaft to be discharged when the slide shaft retracts.

DETAIL DESCRIPTION OF THE INVENTION

An embodiment of the present invention will be described below with reference to the drawings.

Figure 1:
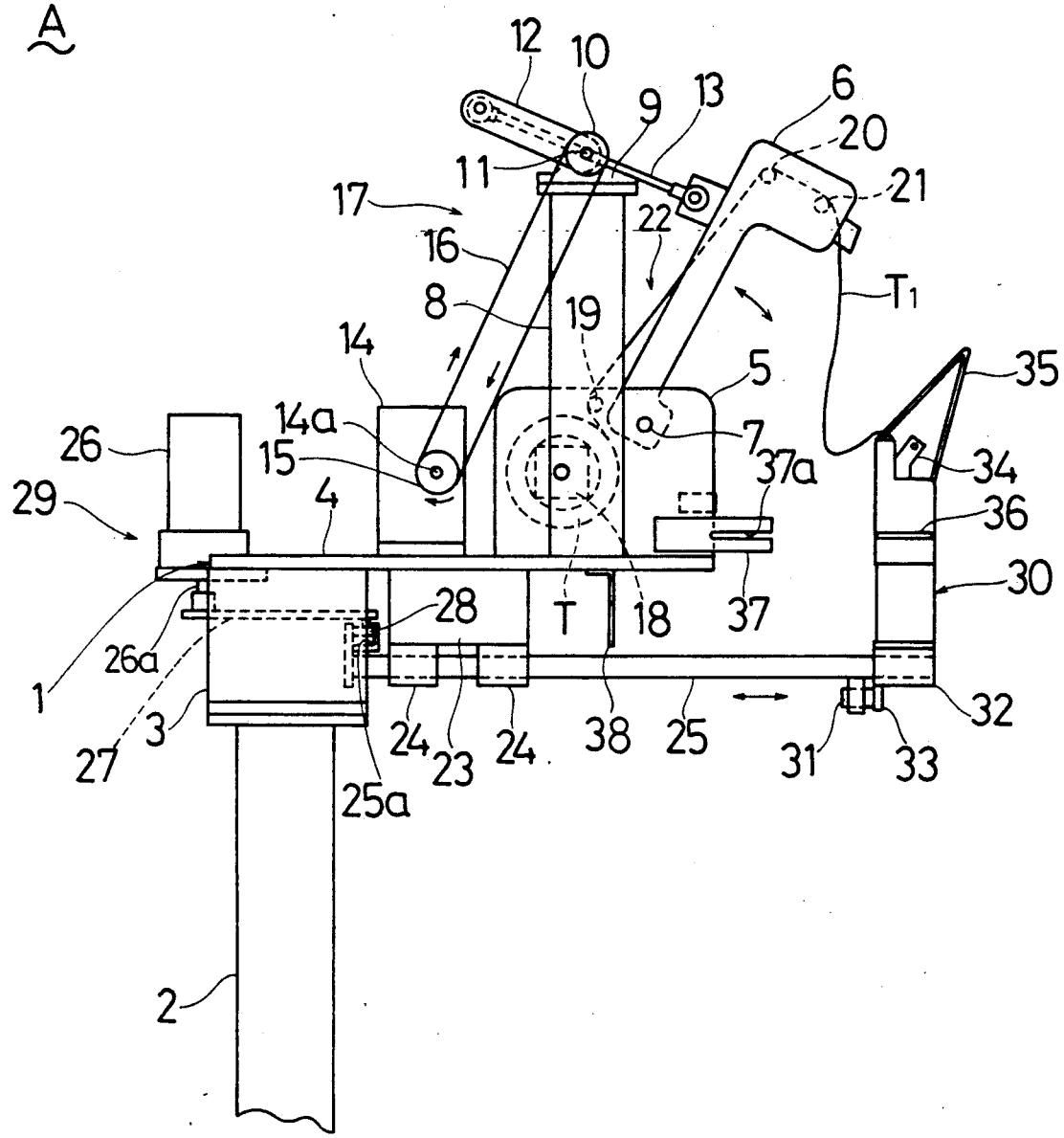
FIG. 1 is a side view of a belt bundling device and
FIGS. 2-7 are explanatory drawings, each showing the operation of the belt bundling device.
Figure 4:
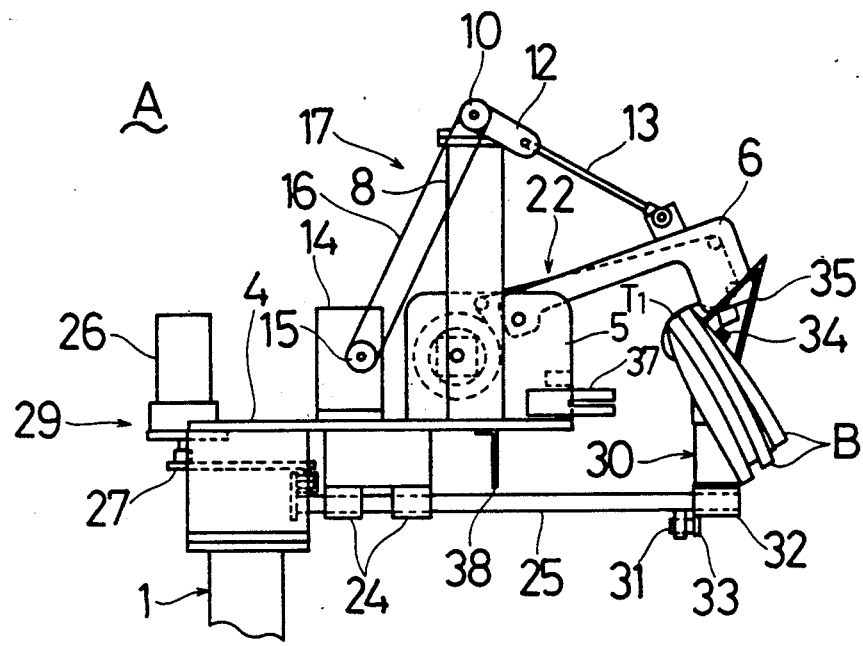

FIG. 1 shows a belt bundling device according to the present invention which bundles a plurality of annular transmission belts B (not shown in FIG. 1). In FIG. 1, A is a belt bundling device as seen from the side, with the right side in the figure being the front part of the device and the left side in the figure being the back part of the device. Reference numeral 1 designates a base stand provided on the floor. This base stand 1 has a leg part 2 and a plate 4 which is connected to the base stand through the medium of a supporting part 3 and extends forward (toward the right side in the drawing). A tape holding plate 5 is provided at the front part of the plate 4. At the upper corner of the front part of the tape holding plate 5, a bundling arm 6 is swingably supported, through the medium of a support axis 7, for movement between a standby position in which the bundling arm 6 extends substantially in a perpendicular direction (as shown in FIG. 1) and a bundling position in which the bundling arm 6 extends substantially in a horizontal direction (as shown in FIG. 4). This bundling arm 6 is defined by a pair of identically shaped right and left plates.

A column 8 is provided on the horizontal plate 4 at the side of the tape holding plate 5. A pillow block 9 is fitted to an upper end of the column 8 and a synchro-pulley 10 is supported rotatably to the pillow block 9 by a horizontal axis of rotation (rotary axle) 11. A crank arm 12 is fitted rotatably to the axis of rotation 11. A top end of the crank arm 12 and the back of a top end of the bundling arm 6 are connected to each other via a link 13. An electric motor 14 is provided on the horizontal plate 4 in the rear of the tape holding plate 5. A synchro-pulley 15 is fitted to an axis of rotation (rotary shaft) 14a of the motor 14. A synchro-belt 16 is trained about the synchro-pulley 15 and the synchro-pulley 10. An arm driving mechanism 17 is composed of the motor 14, the synchro-belt 16 and the crank arm 12. By the rotation of the motor 14, the crank arm 12 is rotated along a plane perpendicular to the horizontal plate 4, whereby the bundling arm 6 is swung. When the crank arm 12 and the link 13 overlap each other, the bundling arm 6 is located at a standby position and when both extend in a straight line, the bundling arm 6 is located at the bundling position.

A tape reel 18 which supports a coiled tape T (adhesive bundling tape $T_1$) and a roulette roller 19, which guides the back (non-adhesive surface) of the tape $T_1$ drawn out from the coiled tape T, are supported rotatably at the tape holding plate 5. Two guide rollers 20, 21 which guide the back of the tape $T_1$ are supported rotatably between both plates at the top end portion of the bundling arm 6. A tape feed mechanism 22 which feeds out the bundling tape $T_1$ in sequence from the top end of the bundling arm 6 is composed of the tape holding plate 5, the tape reel 18 and rollers 19-21.

A bracket 23 is fitted to the bottom of the horizontal plate 4 of the base stand 1. The bracket 23 slidably supports a slide shaft 25 via slide bearings 24 at the lower part of the bracket 23. A roller engaging groove 25a which extends in right and left directions (i.e. normal to the surface of the drawing sheet) is provided at a rear end of the slide shaft 25. An electric motor 26 having a vertical axis of rotation (rotary shaft) 26a is provided at a rear end of the horizontal plate 4. The axis of rotation 26a extends to the underside of the horizontal plate 4 and a crank arm 27 is fitted rotatably to the lower end (free end) of the axis of rotation 26a. A roller 28 which engages with the roller engaging groove 25a is supported rotatably at a free end of the crank arm 27. A shaft driving mechanism 29 is composed of the motor 26 and the crank arm 27. By rotating the crank arm 27 along a horizontal plane, the slide shaft 25 is slid back and forth and when the top end of the crank arm 27 moves to a position in which it extends toward the front end of the device, the slide shaft 25 is located at an extended position (as shown in FIG. 1) and when it moves to a position in which it extends rearwardly, the slide shaft 25 is at a retracted position (as shown in FIG. 7).

A pressing table 30 is provided at a forward position of the device such that a front end of the shaft 25 can be extended into a bracket 32 of the pressing table 30. A permanent magnet 31 is fixed to a forward end of the slide shaft 25 to attach the pressing table thereto. An attraction plate 33 which is attracted by the magnet 31 is fitted to the lower part of the bracket 32. By fitting the slide shaft 25 in the bracket 32 and by attraction of the plate 33 by the magnet 31, the pressing table 30 is separably supported by the slide shaft 25. A pinching plate 34 which pinches a top end portion of the bundling tape $T^1$ extending from the top end of the bundling arm 6, and a guide 35 which guides belts B (articles to be bundled) are fitted to an upper end of the pressing table 30. As shown in FIG. 4, when the slide shaft 25 is at an extended position, the upper end of the pressing table 30 and the top end portion of the bundling arm 6 are made to contact each other in order to bundle the belts B with the bundling tape $T_1$.

A blade (not shown), which cuts the bundling tape $T_1$ when the bundling arm 6 makes contact with the upper end of the pressing table 30 at the bundling position, is fitted to a top end of the bundling arm 6. Pawl parts 36 are provided protrudingly at the right and left sides of the pressing table 30. A pawl receiver 37 having a groove 37a which is engagable with the pawl parts 36 is fitted to a forward end of the tape bundling plate 5. During retraction of the slide shaft 25, the pressing table 30 is separated from the slide shaft 25 by the pawl receiver 37 which engages with the pawl parts 36 at the pressing table 30.

Figure 7:
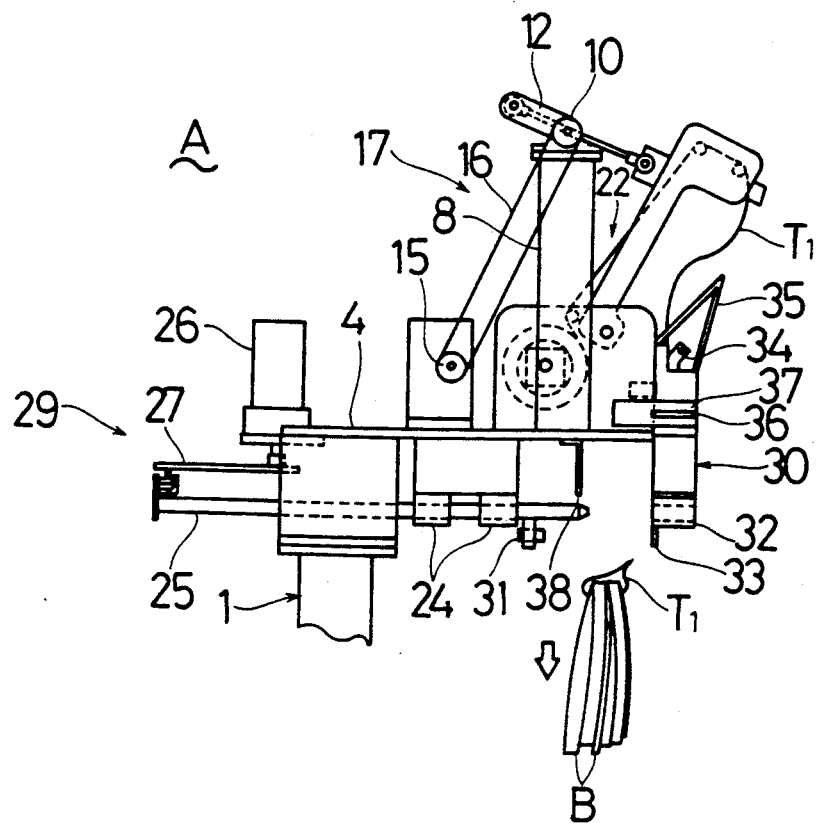

A leaf spring 38 is fitted to the front of the under side of the horizontal plate 4 and, by this leaf spring 38, belts B which are being carried on the slide shaft 25 during retraction thereof are pushed and dropped from the shaft 25 (see FIG. 7).

An explanation of the operation of the above embodiment is set forth below.

Figure 2:
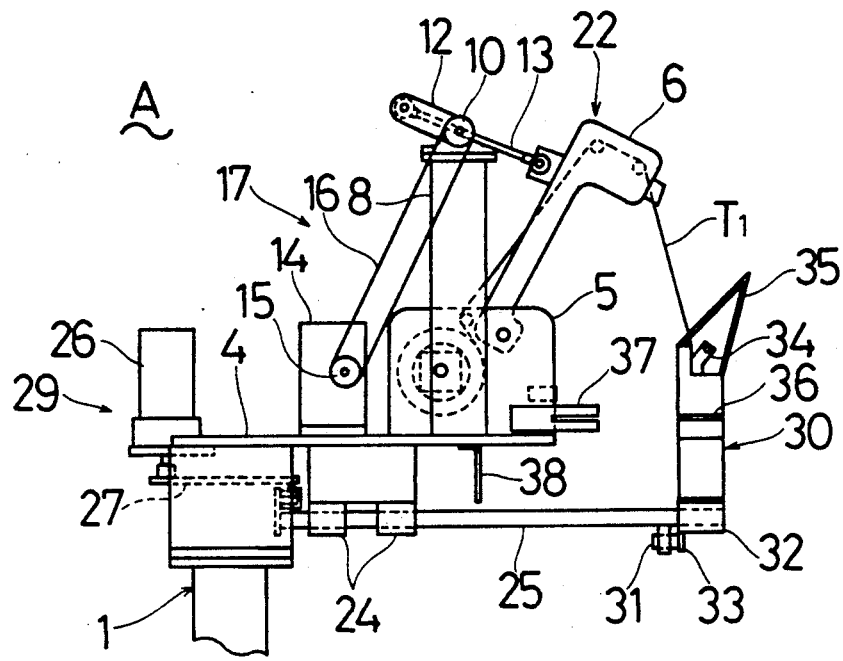

As shown in FIG. 2, at the beginning of operation of the belt bundling device A, the slide shaft 25 is extended by the operation of the motor 26, and its forward end is inserted in the bracket 32 of the pressing table 30, and the attraction plate 33 is attracted to and attached by the magnet 31, whereby the pressing table 30 is supported by the slide shaft 25. Also at the beginning of operation, the bundling arm 6 is at a standby position and a free end of the bundling tape $T_1$ which extends from the top end of the bundling arm 6 is pinched by the pinching plate 34 at the top part of the pressing table 30, whereby the tape $T_1$ extends between the top end of the bundling arm 6 and the upper part of the pressing table 30, with its adhesive surface upward and in a moderately slackened state.

Figure 3:
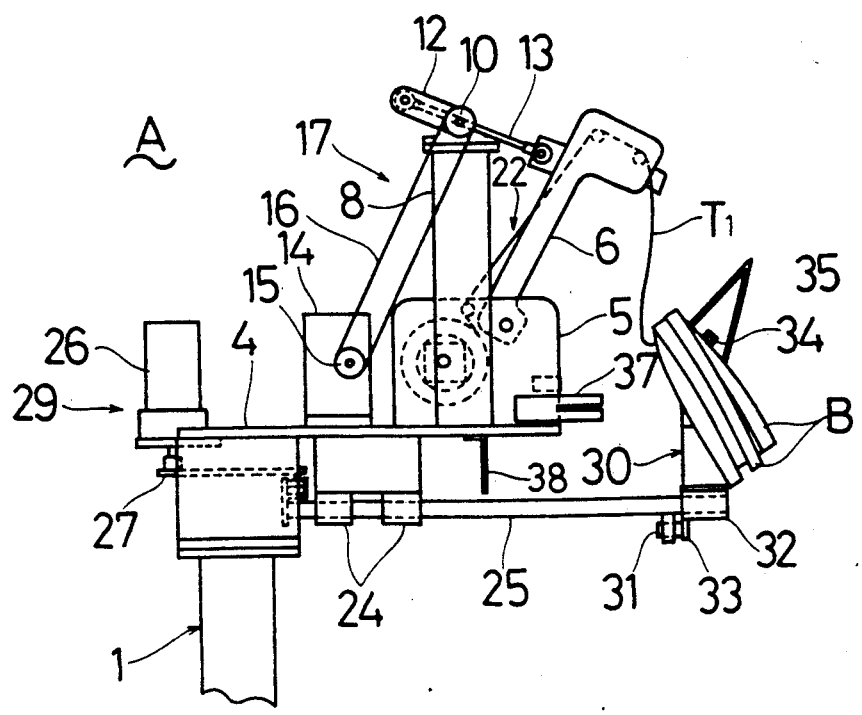

In the above state, as shown in FIG. 3, a plurality of transmission belts B to be bundled are dropped through a gap between the top end of the bundling arm 6 and the pressing table 30 while they are guided along the guide 35 above the pressing table 30 and are placed on the bundling tape $T_1$.

Then, as shown in FIG. 4, the motor 14 operates to rotate the crank arm 12, whereby the bundling arm 6 is rotated from the standby position to the bundling position and the bundling tape $T_1$ is wound around the transmission belts B. When the crank arm 12 rotates by 180° such that the bundling arm 6 reaches the bundling position, the top end of the bundling arm 6 makes contact with an upper end of the pressing table 30, whereupon a loop end portion of the bundling tape $T_1$ which bundled the transmission belts B adheres to the top end of the tape $T_1$ and surplus tape $T_1$ is cut off by a blade. At the same time, an end portion of the cut tape $T_1$ is again pinched by the pinching plate 34 of the pressing table 30.

Figure 5:
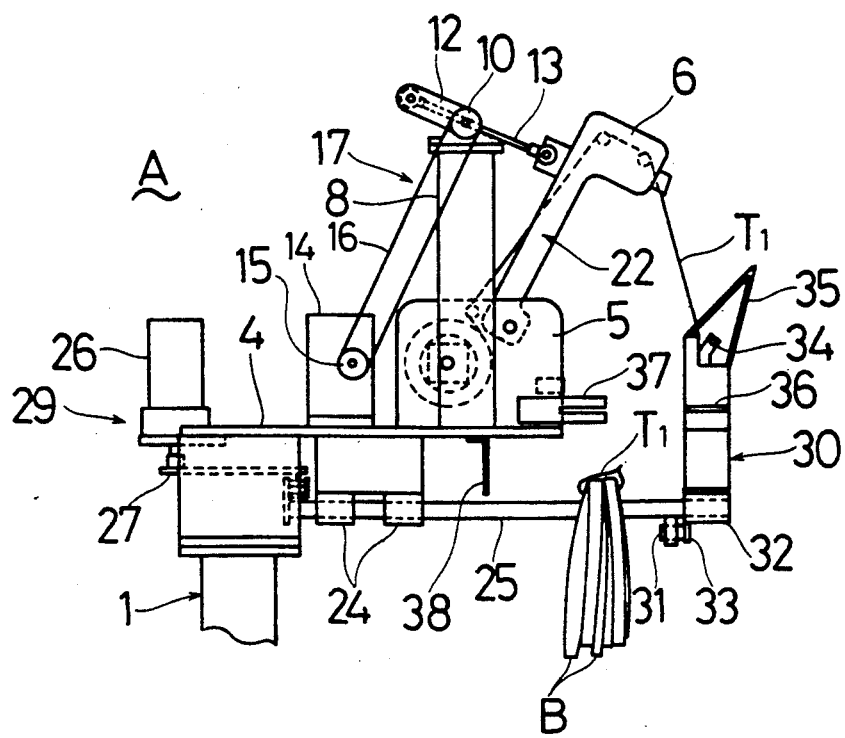

Then, as shown in FIG. 5, the crank arm 12 is again rotated 180° by the motor 14, whereby the bundling arm 6 returns to its original standby position and the tape $T_1$ is extended between the top end of the bundling arm 6 and the pressing table 30. Thus, the belts B are bundled and a bundle of belts B is held on the slide shaft 25 after being passed over the pressing table.

Figure 6:
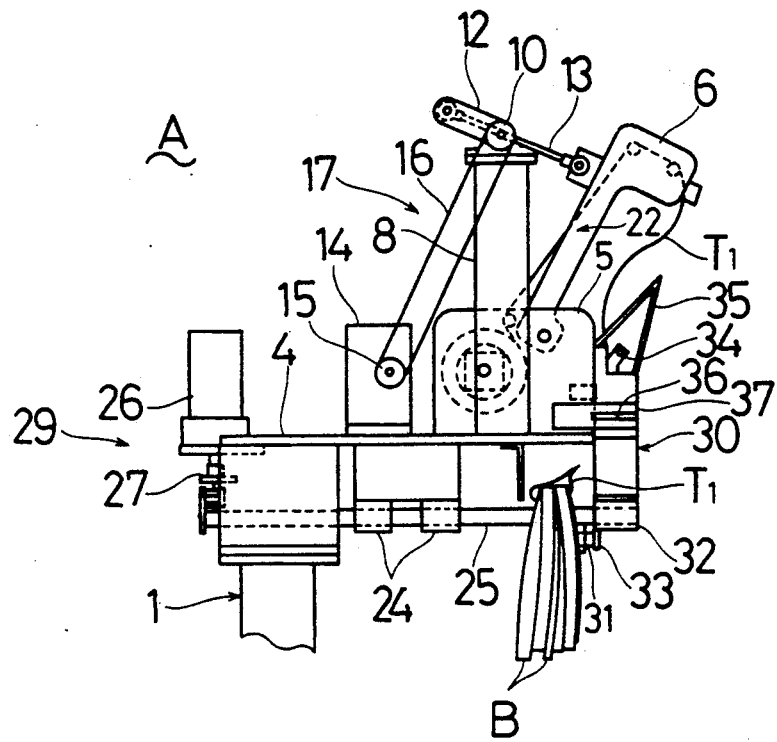

Then, as shown in FIG. 6, the crank arm 27 is rotated by the motor 26, whereby the slide shaft 25 is retracted while it supports at its forward end the pressing table 30 and while belts B are supported thereon. During retraction of the shaft 25, the pawl parts 36 of the pressing table 30 engage with the pawl receiver 37 on the side of the base stand 1 and by this engagement the pressing table 30 is detached from the slide shaft and is fixed to the side of the base stand 1.

Then, as shown in FIG. 7, after the pressing table 30 is fixed to the side of the base table 1, the slide shaft 25 continues to retreat and when the forward end of the slide shaft 25 reaches its fully retracted position, the transmission belts B supported on the slide shaft 25 strike against the left spring 38 at the bottom of the horizontal plate 4 and by control of movement by this leaf spring 38, the belts B are caused to fall through a gap formed between the front end of the slide shaft 25 and the pressing table 30 and are discharged.

After the belts B are discharged, the motor 26 continues to rotate the crank arm 27 so as to move the slide shaft toward its extended position. After the crank arm 27 has been rotated another 180° such that it has made one full rotation since beginning the operation, the motor 26 stops such that the guide shaft 25 is stopped at its fully extended position. In this position, the pressing table 30 engages with the forward end of the slide shaft 25 (as shown in FIG. 2). Thus, one cycle of the belt bundling operation is completed. Thereafter the same bundling operation can be repeated.

In this embodiment, therefore, a tape bundling machine which bundles articles with a bundling tape $T_1$ is used and the pressing table 30 which pinches a forward end of the tape T₁ is made detachable from the slide shaft 25. The pressing table is detached from the slide shaft 25 and transferred to the side of the base stand 1 such that belts B are discharged through a gap between the slide shaft and the pressing table. Therefore, the present invention is simple in construction and can be manufactured at low cost. Moreover, bundling of belts B can be carried out automatically.

The above embodiment is an example of the present invention as applied to a transmission belt bundling device A, but the present invention is operable for bundling of O-rings, electric wire coils and other annular articles.

What is claimed is:

1. A bundling device for bundling articles with a bundling tape, comprising:
    a base stand having front and rear ends;
    a slide shaft reciprocably mounted to said base stand for movement between an extended position in which it is at a forward location and a retracted position in which it is located rearwardly of said forward location;
    a shaft driving means for moving said slide shaft between its extended and retracted positions;
    a pressing table detachably mounted to a forward end of said slide shaft, said pressing table including a pinching means for pinching a free end of said bundling tape;
    a holding means, mounted to said base stand, for detaching said pressing table from said slide shaft as said slide shaft is moved to its retracted position and for holding said pressing table;
    a bundling arm pivotably mounted on said base stand for movement between a standby position in which a free end of said bundling arm is spaced from said pressing table and a bundling position in which said free end of said bundling arm is positioned adjacent said pressing table;
    an arm driving means for moving said bundling arm between its standby and bundling positions; and
    a tape feed means, mounted to said base stand, for feeding the bundling tape from said free end of said bundling arm.

2. A bundling device as recited in claim 1, wherein said arm driving means comprises a first motor having a rotary output shaft, a first crank arm mounted on said base stand for pivotal movement about an axis, and means for transmitting rotation of said rotary output shaft to said first crank arm.

3. A bundling device as recited in claim 2, further comprising
    a column mounted on said base stand and extending upwardly therefrom, said first crank arm being pivotably mounted to an upper end of said column; and
    a link connected between said bundling arm and said first crank arm.

4. A bundling device as recited in claim 1, further comprising
    a magnet mounted to said forward end of said slide shaft for detachably securing said pressing table thereto.

5. A bundling device as recited in claim 1, wherein said slide shaft driving means comprises a second crank arm pivotably mounted to said base stand for pivotable movement about an axis, and a means for causing said second crank arm to pivot.

6. A bundling device as recited in claim 5, wherein said means for causing said second crank arm to pivot comprises a second motor having a rotary output shaft connected to one end of said second crank arm.

7. A bundling device as recited in claim 6, further comprising
    a roller rotatably mounted to the other end of said second crank arm; and
    wherein said slide shaft has an engaging groove provided at a rearward end thereof which receives said roller, such that when said second crank arm is pivoted by said second motor said roller rolls in said engaging groove and said slide shaft is forced to move between its extended and retracted positions.

8. A bundling device as recited in claim 1, further comprising
    means for discharging bundled articles from said bundling device.

9. A bundling device as recited in claim 8, wherein said discharging means comprises a pushing member for pushing bundled articles supported on said slide shaft off said slide shaft as said slide shaft is moved toward its retracted position.

* * * * *